(12) United States Patent
Coffy et al.

(10) Patent No.: US 8,847,243 B2
(45) Date of Patent: Sep. 30, 2014

(54) SEMICONDUCTOR PACKAGE COMPRISING AN OPTICAL SEMICONDUCTOR DEVICE

(75) Inventors: Romain Coffy, Saint Martin le Vinoux (FR); Emmanuelle Vigier-Blanc, Le Sappey en Chartreuse (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 13/433,447

(22) Filed: Mar. 29, 2012

(65) Prior Publication Data
US 2012/0248625 A1  Oct. 4, 2012

(30) Foreign Application Priority Data
Apr. 1, 2011  (FR) ..................................... 11 52824

(51) Int. Cl.
| | | |
|---|---|---|
| *H01L 27/15* | (2006.01) | |
| *H01L 29/267* | (2006.01) | |
| *H01L 31/12* | (2006.01) | |
| *H01L 33/00* | (2010.01) | |
| *H01L 31/0203* | (2014.01) | |
| *H01L 27/146* | (2006.01) | |
| *H01L 21/00* | (2006.01) | |
| *H01L 31/167* | (2006.01) | |
| *H01L 25/16* | (2006.01) | |
| *G01S 17/02* | (2006.01) | |
| *H01L 31/0216* | (2014.01) | |
| *H01L 31/173* | (2006.01) | |
| *G01S 7/481* | (2006.01) | |

(52) U.S. Cl.
CPC ............ *G01S 7/4813* (2013.01); *H01L 31/167* (2013.01); *H01L 25/167* (2013.01); *G01S 17/026* (2013.01); *H01L 31/02164* (2013.01); *H01L 27/14618* (2013.01); *H01L 31/173* (2013.01); *H01L 31/0203* (2013.01)
USPC ................... 257/81; 257/80; 257/84; 257/99; 257/100; 257/433; 257/435; 257/E31.117; 438/24; 438/25; 438/26; 438/28; 438/64; 438/66; 438/116

(58) Field of Classification Search
CPC ............ H01L 31/02164; H01L 25/167; H01L 31/167; H01L 31/173; H01L 31/0203; H01L 27/14618; G01S 7/4813; G01S 17/026
USPC .......... 257/80–82, 84, 99, 100, 774, E23.145, 257/E31.093, E25.032, 431–435, E31.117; 438/24–28, 64–68, 116
See application file for complete search history.

(56) References Cited

U.S. PATENT DOCUMENTS 5,818,915 A * 10/1998 Hayes et al. .................. 455/405
2002/0174683 A1 * 11/2002 Laborde et al. ................ 65/17.3
(Continued)

FOREIGN PATENT DOCUMENTS

| CN | 101936752 A | 1/2011 |
|---|---|---|
| CN | 202736913 U | 2/2013 |

(Continued)

OTHER PUBLICATIONS

INPI Search Report and Written Opinion for FR 1152824 dated Nov. 1, 2011 (7 pages).

(Continued)

*Primary Examiner* — Fernando L Toledo
*Assistant Examiner* — Aaron Gray
(74) *Attorney, Agent, or Firm* — Gardere Wynne Sewell LLP

(57) ABSTRACT

A semiconductor package includes a transmissive support plate and includes at least one elongate hole. An integrated circuit semiconductor device is mounted on a rear face of the support plate. The semiconductor device includes first and second optical elements oriented towards the rear face of the support plate, where the first and second optical elements are placed on either side of the elongate hole. An encapsulation material made of an opaque material encapsulates the semiconductor device and fills the elongate hole so as to form an optical insulation partition between the first and second optical elements. A cavity is left, however, between each optical element and a rear face of the support plate.

37 Claims, 6 Drawing Sheets

(56) References Cited

U.S. PATENT DOCUMENTS

| | | |
|---|---|---|
| 2007/0138395 A1 | 6/2007 | Lane et al. |
| 2008/0309224 A1* | 12/2008 | Kwak et al. .................... 313/504 |
| 2009/0053856 A1* | 2/2009 | Ohsumi ......................... 438/113 |
| 2009/0068798 A1* | 3/2009 | Oliver et al. ................... 438/127 |
| 2009/0166784 A1* | 7/2009 | Honda ........................... 257/432 |
| 2010/0133576 A1* | 6/2010 | Chen et al. ...................... 257/98 |
| 2010/0258710 A1* | 10/2010 | Wiese et al. ................ 250/214.1 |
| 2010/0327164 A1* | 12/2010 | Costello et al. ............. 250/338.1 |
| 2011/0057129 A1 | 3/2011 | Yao et al. |
| 2012/0129579 A1* | 5/2012 | Tam ........................... 455/575.1 |

FOREIGN PATENT DOCUMENTS

| | | |
|---|---|---|
| EP | 1244151 A2 | 9/2002 |
| EP | 2261977 A1 | 12/2010 |

OTHER PUBLICATIONS

Office Action for CN 201210098819.7 mailed May 29, 2014 (11 pages).

* cited by examiner

SEMICONDUCTOR PACKAGE COMPRISING AN OPTICAL SEMICONDUCTOR DEVICE

PRIORITY CLAIM

This application claims priority from French Application for Patent No. 1152824 filed Apr. 1, 2011, the disclosure of which is hereby incorporated by reference.

TECHNICAL FIELD

The present invention relates to the field of semiconductor packages comprising, for example, optical semiconductors devices.

BACKGROUND

A semiconductor package is known which comprises a mounting plate, a first integrated circuit chip provided with a first optical detector, a second integrated circuit chip provided with a second optical detector, and a third integrated circuit chip provided with an optical emitter, these three chips being adhered onto the mounting plate. An opaque cover is glued onto the periphery of the mounting plate and optically insulates each of the chips by virtue of the existence of three separate chambers. The cover has three separate openings, formed facing the three abovementioned optical elements and provided with three transparent protection plates.

This known semiconductor package requires the use of a mounting plate and the fabrication of a specially dimensioned cover, and further involves numerous mounting steps and difficulties in electrically connecting the integrated circuit chips externally and still further has large dimensions compared to the size of the integrated circuit chips.

There is a need in the art for a semiconductor package comprising, for example, an optical semiconductor device, which is generally simpler and, consequently, less costly.

SUMMARY

A semiconductor package comprises: a support plate made of a material that can be passed through by a light radiation and having at least one elongate hole open at least on the side of a rear face of this support plate, an integrated circuit semiconductor device mounted on the rear face of said support plate and having at least two optical elements turned away from the side of the rear face of said support plate, these optical elements being placed on either side of said elongate hole, and an encapsulation block made of an opaque material encapsulating the semiconductor device on said support plate and filling said elongate hole, forming an optical insulation partition between said optical elements and leaving cavities remaining between the optical elements and the support plate.

According to a variant embodiment, the abovementioned hole may pass through the support plate, in the direction of the thickness thereof.

According to another variant embodiment, 1, said hole may not pass through the support plate and a layer is left remaining on the side of the front face of the support plate.

Said hole may extend from one edge to the opposite edge of the support plate.

The encapsulation block may at least partially surround the support plate.

The support plate may be provided, on the side of the semiconductor device, with electrical connection tracks which extend under the semiconductor device and are linked to bump contacts thereof and which extend beyond the semiconductor device and are linked to external electrical connection means.

The external electrical connection means may comprise electrical connection vias passing through the encapsulation block.

The semiconductor device may comprise at least one main receiving optical element and at least one emitting optical element, which are situated on the side of the support plate and on either side of said hole filled with opaque material.

The main receiving optical element and the emitting optical element may be formed in separate chips.

An opaque layer may be formed on the front face of the support plate opposite the semiconductor device, this opaque layer having openings in this layer facing the main receiving optical element and the emitting optical element.

The semiconductor device may comprise a secondary receiving optical element placed on the same side of said hole as said emitting optical element.

The opaque layer may extend in front of the secondary receiving optical element.

The semiconductor device may comprise at least one main receiving optical element and at least one secondary receiving optical element, which are situated on the side of the support plate and on either side of said hole filled with opaque material.

An opaque layer may be formed on the front face of the support plate opposite the semiconductor device, this opaque layer having openings in this opaque layer situated facing the main receiving optical element and the secondary receiving optical element.

The main receiving optical element and the secondary receiving optical element may be formed in a single chip.

Barriers may extend between the semiconductor device and the support plate and respectively around said optical elements.

There is also proposed a mobile telephone which comprises, internally, a semiconductor package, the shell of the telephone having at least one opening situated facing at least one of said optical elements.

BRIEF DESCRIPTION OF THE DRAWINGS

Semiconductor packages according to the invention will now be described by way of non-limiting examples and illustrated by the drawing in which.

DETAILED DESCRIPTION OF THE DRAWINGS

Figure 1:
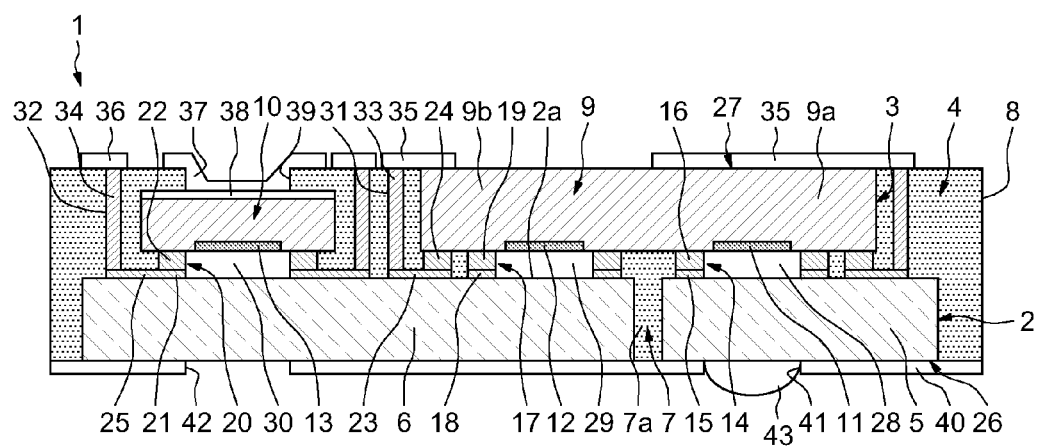
FIG. 1 represents a cross section of a variant embodiment of a semiconductor package.
Figure 2:
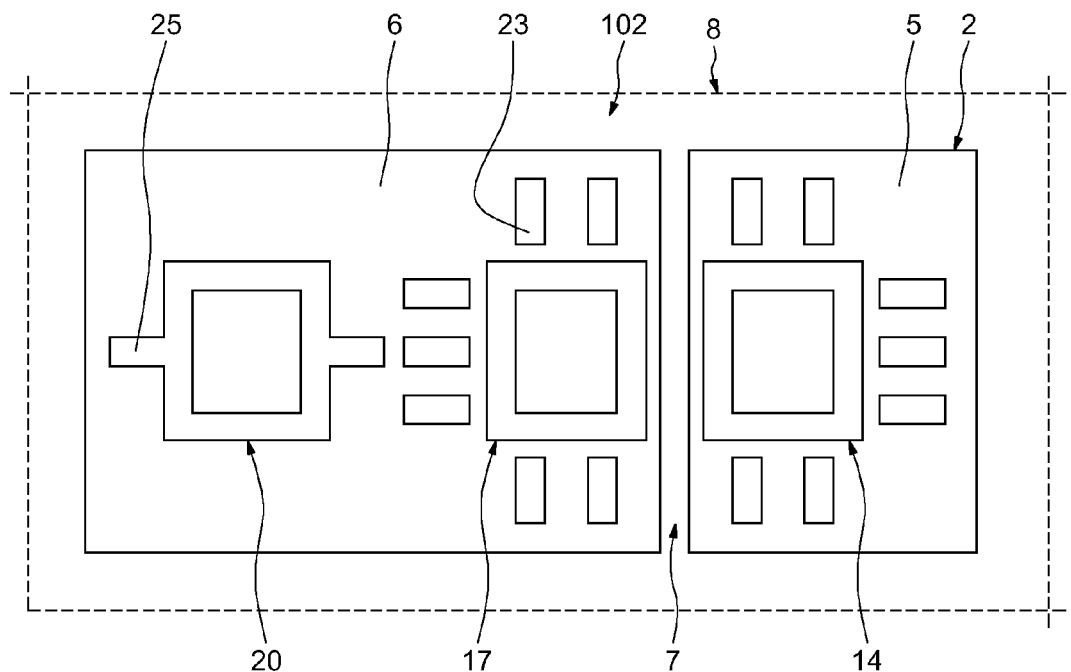
FIG. 2 represents a plan view of a support plate equipped with electrical connection tracks for the semiconductor package of FIG. 1.
Figure 3:
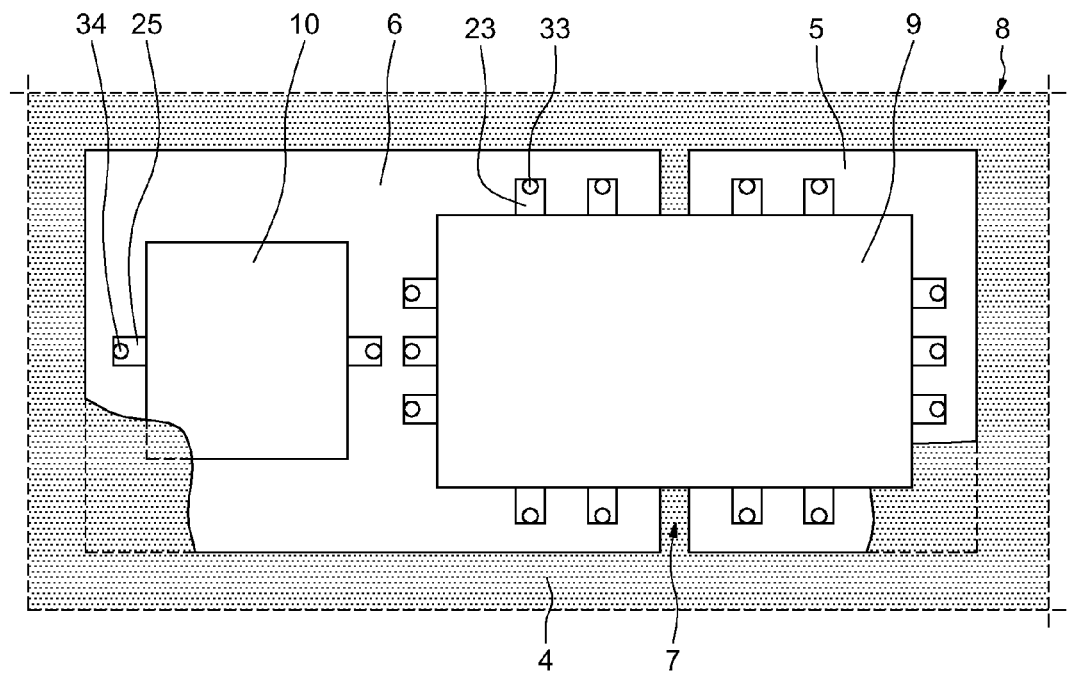
FIG. 3 represents a plan view of the support plate equipped with a semiconductor device of the semiconductor package of FIG. 1.

Reference is now made to FIGS. 1-3. A semiconductor package 1, which may take the form of a rectangular parallelepiped, comprises a stack comprising, from front to back, a support plate 2 made of a material that can be passed through by a light radiation, for example glass, and an integrated circuit semiconductor device 3 situated on the side of a rear face 2a of the support plate 2 and comprises an encapsulation block 4, for example made of an epoxy resin, for the semiconductor device 3 on the support plate 2.

According to the example represented, the support plate 2 comprises first and second rectangular support plate portions 5 and 6, arranged one alongside the other so as to define, between their facing edges, a hole 7, their other edges being arranged at a distance, inside the package 1, and parallel to the periphery 8 of the package 1.

According to the example represented, the semiconductor device 3 comprises a first integrated circuit chip 9 which passes over the hole 7 and which has a part 9a situated above the support plate portion 5 and a part 9b above the support plate portion 6 and comprises a second integrated circuit chip 10 which is placed above the support plate portion 6, the edges of the integrated circuit chips 9 and 10 being arranged parallel to the edges of the support plate portions 5 and 6.

The part 9a of the first integrated circuit chip 9 comprises, in its front face, a first optical element 11 situated facing the support plate portion 5, forming a first light radiation receiver. This part 9b of the first integrated circuit chip 9 also comprises, in its front face, a second optical element 12 situated facing the support plate portion 6, forming a second light radiation receiver.

The second integrated circuit chip 10 comprises, in its front face, an optical element 13 situated facing the support plate portion 6, forming a light radiation emitter.

Between the rear face of the support plate portion 5 and the front face of the first integrated circuit chip 9, an annular metallic barrier 14 is formed which surrounds the first receiving optical element 11 of this chip 9. The metallic barrier 14 comprises, one on top of the other, a metallic annular track 15 on the rear face of the support plate portion 5 and a metallic annular track 16 on the front face of the first integrated circuit chip 9.

Between the rear face of the support plate portion 6 and the front face of the first integrated circuit chip 9, an annular metallic barrier 17 is formed which surrounds the second receiving optical element 12 of this chip 9. The metallic barrier 17 comprises, one on top of the other, a metallic annular track 18 on the rear face of the support plate portion 6 and a metallic annular track 19 on the front face of the first integrated circuit chip 9.

Between the rear face of the support plate portion 6 and the front face of the integrated circuit chip 10, an annular metallic barrier 20 is formed which surrounds the receiving optical element 13 of this chip 10. The metallic barrier 20 comprises, one on top of the other, a metallic annular track 21 on the rear face of the support plate portion 6 and a metallic annular track 22 on the front face of the first integrated circuit chip 10 and linked to the integrated circuits thereof.

On the rear faces of the support plate portions 5 and 6, a plurality of electrical connection metallic tracks 23 are formed which extend under the first integrated circuit chip 9, at a distance from the periphery of the barriers 14 and 17, and are electrically connected to this first chip by electrical connection bump contacts 24, and which extend beyond the edges of the first chip 9.

On the rear face of the support plate portion 6, at least one electrical connection metallic track 25 is formed which extends under the integrated circuit chip 10 and is linked to the annular barrier 20 and which extends beyond the edges of this chip 10.

The encapsulation block 4 envelops the periphery of the support plate portions 5 and 6 and of the integrated circuit chips 9 and 10, fills the spaces between the support plate portions 5 and 6 and the integrated circuit chips 9 and 10 as far as the periphery of the annular barriers 14, 17 and 20, fills the hole 7 between the support plate portions 5 as far as the front face of the integrated circuit chip 9, so as to form an opaque partition 7a, fills the space between the integrated circuit chips 9 and 10 and covers the rear face of the integrated circuit chip 10.

Thus, the periphery of the encapsulation block 4 constitutes the periphery 8 of the package 1. The front faces of the support plate portions 5 and 6 and the front face of the encapsulation block 4 constitute a front face 26. The rear face of the integrated circuit chip 9 and the rear face of the encapsulation block 4 constitute a rear face 27.

Furthermore, there remains a cavity 28 between the optical element 11 of the integrated circuit chip 9, inside the annular barrier 14, a cavity 29 between the optical element 12 of the integrated circuit chip 9, inside the annular barrier 17, and a cavity 30 between the optical element 13 of the integrated circuit chip 10, inside the annular barrier 20.

Behind the electrical connection tracks 23 and 25, the encapsulation block 4 is provided with through holes 31 and 32 which are filled with a metal so as to form the connection vias 33 and 34.

On the rear face 27, rear electrical connection tracks 35 linked to the electrical connection vias 33 are formed, so that a rear external electrical connection of the integrated circuit chip 9 can be made via the electrical connection tracks 23, the electrical connection bump contacts 24, the electrical connection vias 33 and the electrical connection tracks 35.

On the rear face 27, there are also formed a rear electrical connection track 36 linked to the electrical connection via 34 and a rear electrical connection track 37 which is linked to a rear electrical connection bump contact 38 of the integrated circuit chip 10 through a rear hole 39 formed in the encapsulation block 4, so that a rear external electrical connection of the integrated circuit chip 10 can be made via the electrical connection track 25, the annular barrier 20, the electrical connection via 34 and the electrical connection track 36, as well as via the electrical connection track 37 and the electrical connection bump contact 38.

Furthermore, the front face 26 is covered with a front layer 40 made of an opaque material. This front layer has an opening 41 formed facing the receiving optical element 11 of the integrated circuit chip 9 and an opening 42 formed facing the emitting optical element 13 of the integrated circuit chip 10. An optical lens 43 may be installed in the opening 41. An optical lens could also be associated with the opening 42 of the opaque layer 40.

The semiconductor package 1 which has just been described offers the following advantages.

The glass support plate portion 5 and the cavity 28 associated with the receiving optical element 11, on the one hand, and the glass support plate portion 6 and the cavities 29 and 30 associated with the receiving optical element 12 and the emitting optical element 13, on the other hand, are optically insulated by virtue of the encapsulation block 4, notably by virtue of the fact that this encapsulation block 4 fills the hole 7 between the support plate portions 5 and 6 and extends as far as the front face of the integrated circuit chip 9.

Thus, the receiving optical element 11 of the integrated circuit chip 9 can receive only an external light radiation, through the opening 41 of the opaque front layer 40 with which the optical lens 43 is associated, through the support plate portion 5 and through the cavity 28, without the light radiation emitted by the emitting optical element 13 of the integrated circuit chip 10 being able to reach it via any pathway internal to the semiconductor package 1.

The emitting optical element 13 of the integrated circuit chip 10 emits a light radiation through the cavity 30, the glass support plate portion 6 and the opening 42 of the opaque front layer 40.

The receiving optical element 12 of the integrated circuit chip 9 receives optical radiation mostly from the emitting optical element 13 of the integrated circuit chip 10 and secondarily from the optical radiation from the outside via the opening 42 of the opaque front layer 40, through the glass support plate portion 6 and the cavity 29, the signal from the receiving optical element 12 being able to form a reference for the analysis of the signal from the receiving optical element 11 of the integrated circuit chip 9.

The result of the above is that the semiconductor package 1 can be used as a proximity detector.

The semiconductor package 1 can be obtained from a wafer-scale fabrication of identical semiconductor packages, fabricated as follows.

Figure 4:
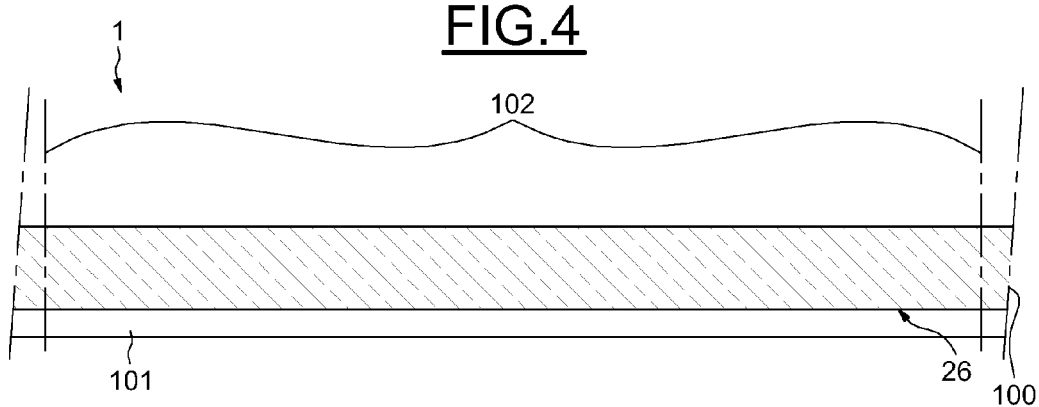
FIGS. 4 to 12 represent, in cross sections, steps in fabricating the semiconductor package of FIG. 1.

As illustrated in FIG. 4, a glass wafer 100 is installed on a planar support 101, held, for example, via a double-sided adhesive. This wafer has a surface such that a plurality of placements 102, one alongside the other in the form of a matrix (FIG. 2), corresponds to a plurality of semiconductor packages 1 to be fabricated.

Figure 5:
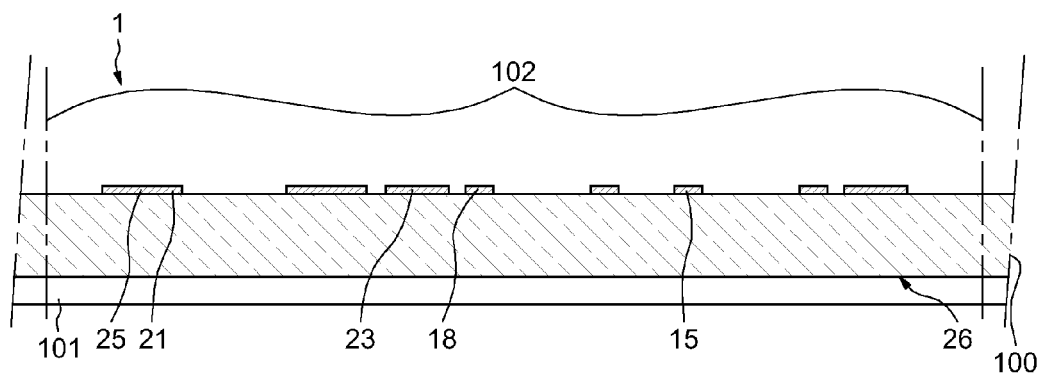

Next, as illustrated in FIG. 5, the metallic annular tracks 15, 18 and 21 of the barriers 14, 17 and 20, as well as the metallic tracks 23 and 25, are produced simultaneously, on each placement 102, in accordance with the drawing of FIG. 2.

Figure 6:
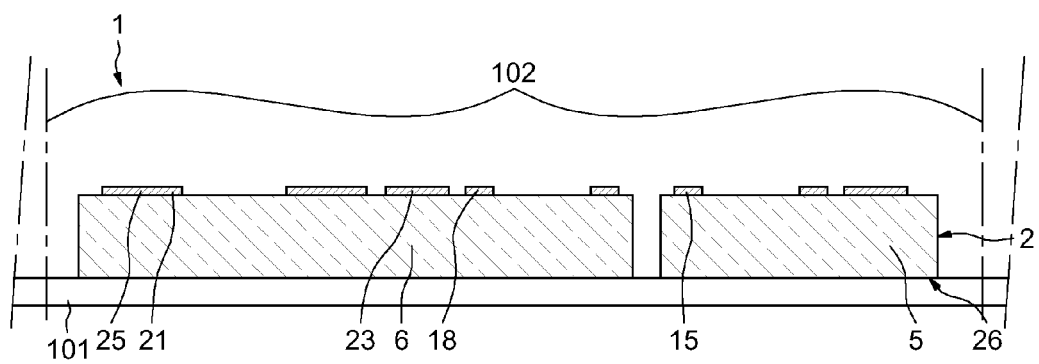

Next, as illustrated in FIG. 6, an etching of the glass wafer 100 is performed so as to leave remaining, on each placement 102, only the support plate portions 5 and 6. This operation can be carried out by chemical etching, by laser rays, by sanding or by ionic etching.

Figure 7:
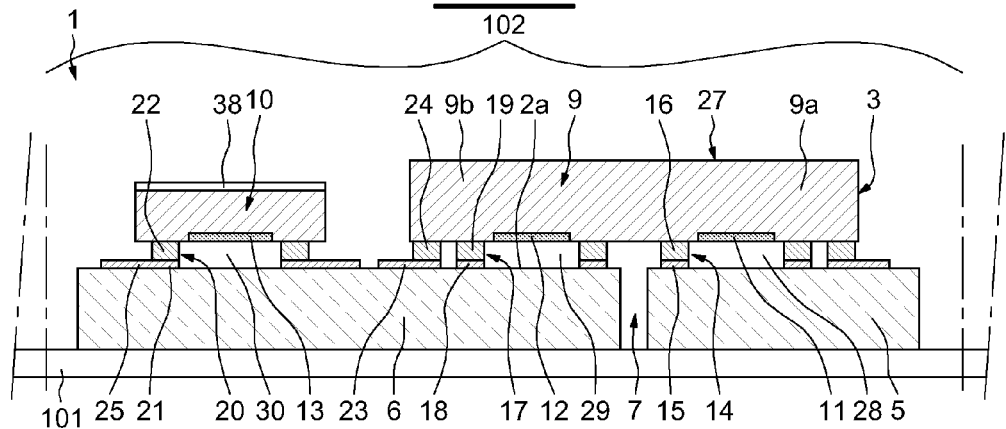

Next, as illustrated in FIG. 7, the integrated circuit chips 9 and 10 are put in place, by interposing, between these chips 9 and 10 and the corresponding tracks, the metallic annular tracks 16, 19 and 22 and the metallic bump contacts 24. This operation can be carried out by surface-mounting, then by placing the assembly in an oven.

Figure 8:
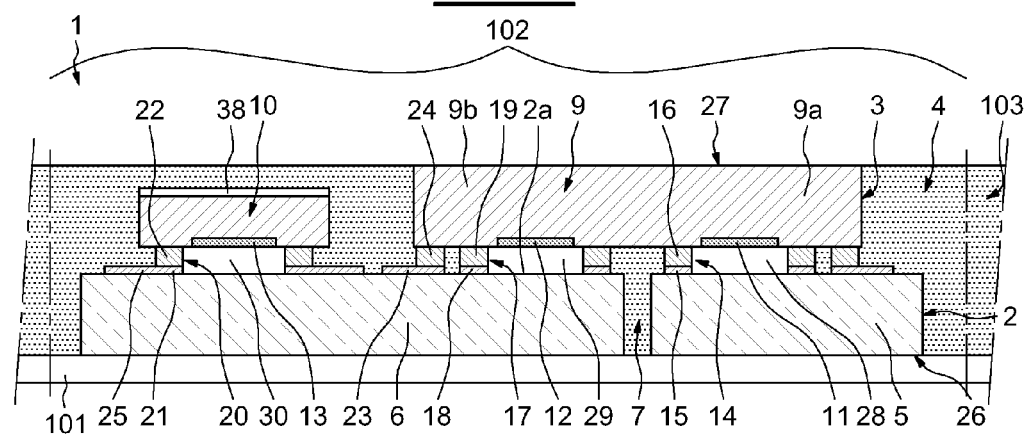

Next, as illustrated in FIG. 8, a resin layer 103 is formed, for example by compression molding or by transfer molding, and, after hardening, a rear planarization of this layer 103, to form, in each placement 102, encapsulation blocks 4 having the front face 26 and the rear face 27 interlinked.

Figure 9:
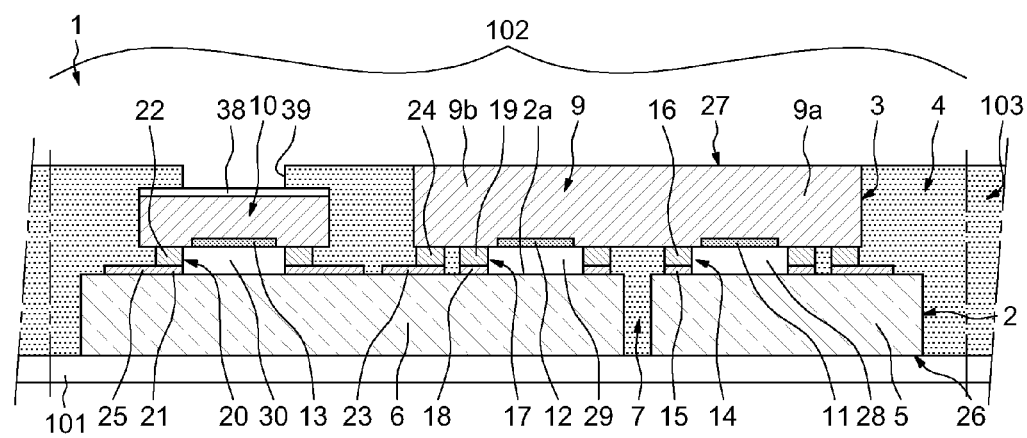

Next, as illustrated in FIG. 9, in each placement 102, holes for the openings 39 are produced in the layer of resin 103, on the rear of the integrated circuit chip 10.

Figure 10:
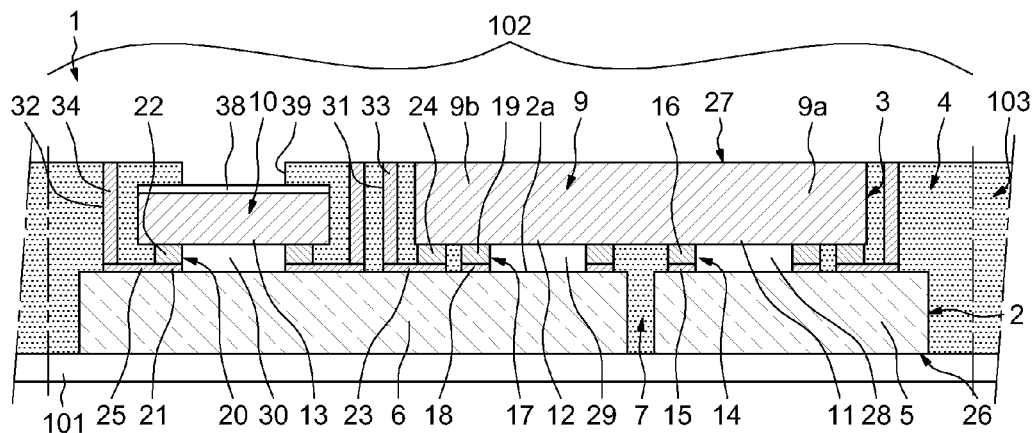

Next, as illustrated in FIG. 10, in each placement 102, holes 31 and 32 are produced in the layer of resin 103 on the rear of tracks 23 and 25 and these holes are filled with metal so as to form the electrical connection vias 33 and 34.

Figure 11:
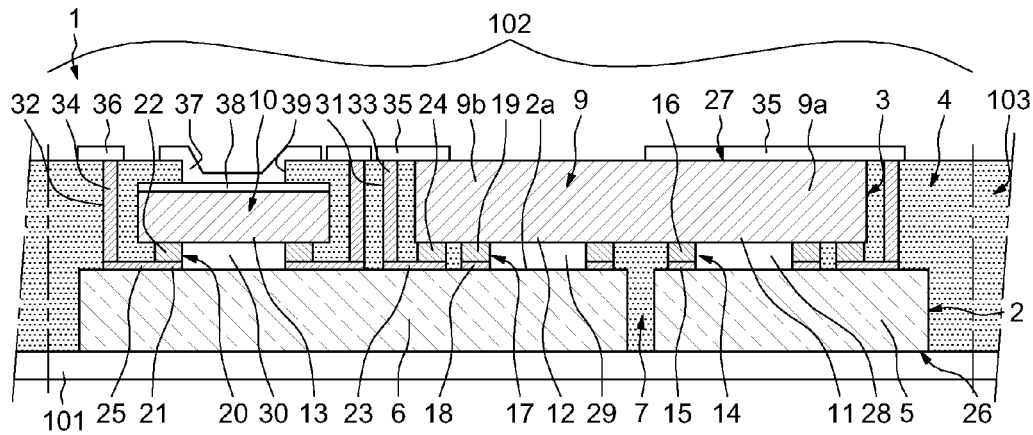

Next, as illustrated in FIG. 11, in each placement 102, the rear opening 39 is produced and then the rear tracks 35 and 37 are produced.

Figure 12:
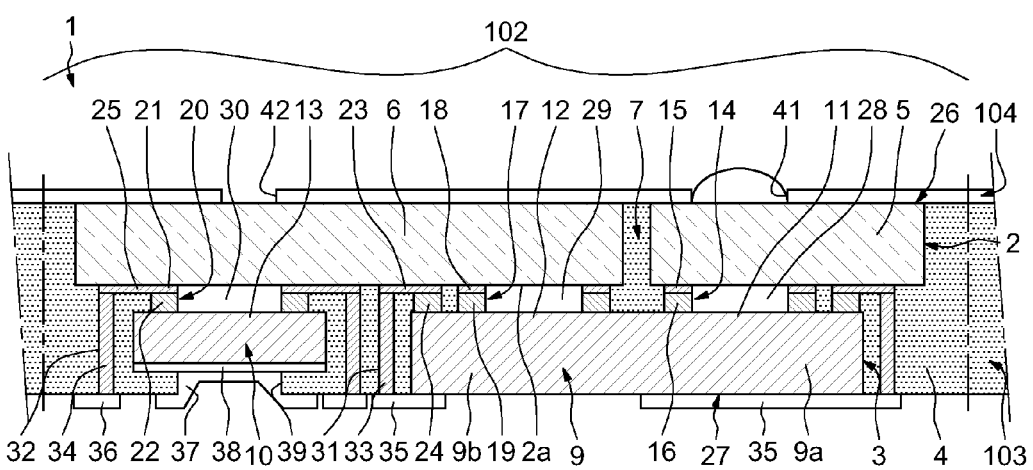

Next, as illustrated in FIG. 12, after having removed the support 101, a front layer 104 is produced, to form, in each placement 102, the front layer 40, and openings 41 and 42 are produced in each placement 102. Next, optical elements 43 are installed in each placement 102.

Next, the semiconductor packages 1 are singularized, by cutting along the common edges between the placements 102.

According to a variant embodiment, the support plate portions 5 and 6 could be separated by a non-through hole 7 taking the form of a groove produced in the fabrication step described previously with reference to FIG. 6. Thus, the support plate portions 5 and 6 would be linked, at the front, by a thin remaining layer.

According to another variant embodiment, the support plate 2 could extend to the sides 8 of the package 1 and have a through or non-through hole 7 going from one side to the other, produced in the form of crossed grooves in the fabrication step described previously with reference to FIG. 6.

Figure 13:
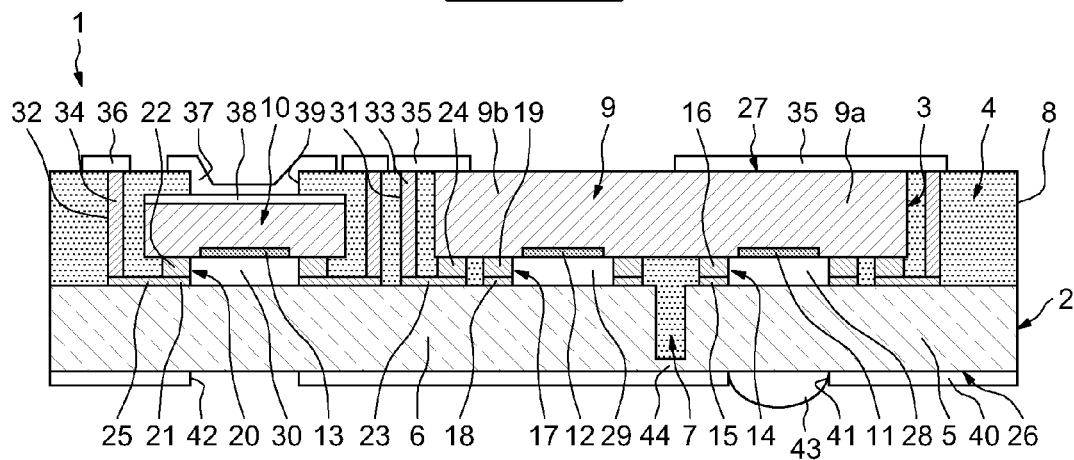
FIG. 13 represents a cross section of a variant embodiment of the semiconductor package of FIG. 1.

FIG. 13 shows a support plate 2 extending to the sides 8 of the package 1, provided with a non-through hole 7 going from one side to the other, the support plate portions 5 and 6 being linked, at the front, by a thin remaining layer 44. In this case, at least the sides of the resulting support plate portions 5 and 6 could possibly be covered, for example, with paint, or the semiconductor package 1 could be placed in an opaque volume of an envelope having openings facing the openings 41 and 42.

Figure 14:
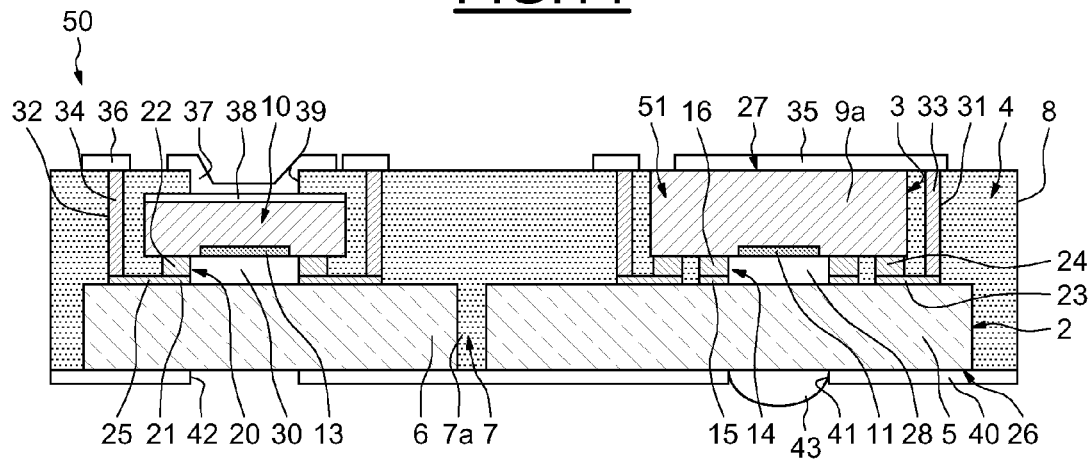
FIG. 14 represents a cross section of another variant embodiment of a semiconductor package.

According to another variant embodiment illustrated in FIG. 14, a semiconductor package 50 is distinguished from the semiconductor package 1 described previously by the fact that its integrated circuit semiconductor device 3 comprises an integrated circuit chip 51, corresponding to the part 9a of the integrated circuit chip 9 and provided only with the receiving optical element 11, and the integrated circuit chip 10 provided with the emitting optical element 13. The integrated circuit chip 51 is then associated only with a barrier 14 and with tracks 23 and suitable electrical connection vias 33.

The hole 7 in the support plate 2 can then extend in an area situated between the integrated circuit chip 10 and the integrated circuit chip 51.

Figure 15:
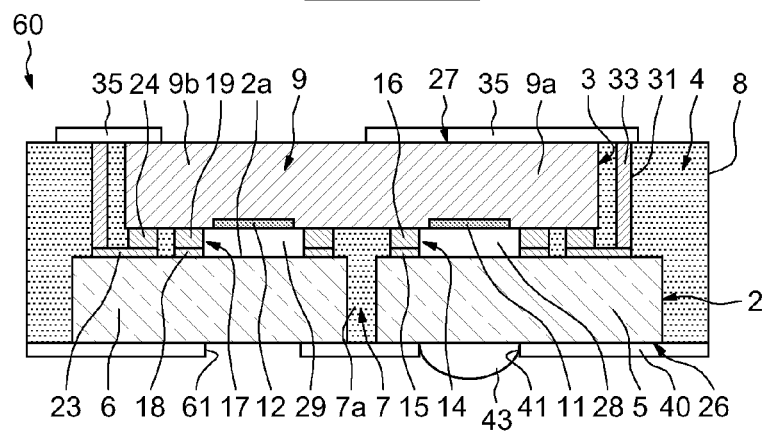
FIG. 15 represents another variant embodiment of a semiconductor package.

According to another variant embodiment illustrated in FIG. 15, a semiconductor package 60 is distinguished from the semiconductor device 1 described previously by the fact that its integrated circuit semiconductor device 3 comprises only the integrated circuit chip 9, the integrated circuit chip 10 being eliminated.

In this case, the opaque front external layer 40 has a complementary opening 61 situated facing the receiving optical element 12.

In this case, it may be advantageous for the support plate portions 5 and 6 to be treated so as to form different filters.

Generally, the various fabrication steps described can be obtained by implementing conventional means used in the field of microelectronics.

The semiconductor packages that have just been described, in particular the semiconductor package 1, could be installed inside the envelope or the shell of a mobile telephone, having openings facing the openings 41 and 42 so as to form a proximity detector capable of detecting the presence or the absence of an object or of a part of the human body in order to generate a particular command in the electronic circuits of the telephone.

The present invention is not limited to the examples described above. Many other variant embodiments are possible, without departing from the scope defined by the appended claims.

What is claimed is:

1. A semiconductor package, comprising:
   a support plate made of a light radiation transmissive material and having at least one elongate hole open at least on a rear face of this support plate,
   an integrated circuit semiconductor device mounted on the rear face of said support plate and having at least two optical elements facing the rear face of said support plate, the integrated circuit semiconductor device passing above the elongate hole and at least one of the at least two optical elements being placed on each side of said elongate hole, and an encapsulation block made of a single-composition opaque material encapsulating the semiconductor device on said support plate at least by enveloping the periphery of the integrated circuit semiconductor device and filling said elongate hole to form an optical insulation partition between said optical elements and leaving empty cavities remaining between the optical elements and the support plate.

2. The package according to claim 1, in which, in the direction of its thickness, the hole passes through the support plate.

3. The package according to claim 1, in which, in the direction of its thickness, the hole does not pass through the support plate and leaves a layer remaining on a front face of the support plate.

4. The package according to claim 1, in which the hole extends from the rear face to a front face of the support plate.

5. The package according to claim 1, in which the encapsulation block at least partially surrounds the support plate.

6. The package according to claim 1, in which the support plate is provided, on the side of the semiconductor device, with electrical connection tracks which extend under the semiconductor device and are linked to bump contacts thereof and which extend beyond the semiconductor device and are linked to external electrical connection structure.

7. The package according to claim 6, in which the external electrical connection structure comprises electrical connection vias passing through the encapsulation block.

8. The package according to claim 1, in which the semiconductor device comprises at least one main receiving optical element and the at least one emitting optical element, which are situated on the rear face the support plate and on either side of said hole filled with opaque material.

9. The package according to claim 8, in which the main receiving optical element and the emitting optical element are formed in separate chips.

10. The package according to claim 8, comprising an opaque layer on a front face of the support plate opposite the semiconductor device, this opaque layer having openings in this layer facing the main receiving optical element and the emitting optical element.

11. The package according to claim 8, in which the semiconductor device comprises a secondary receiving optical element placed on the same side of said hole as said emitting optical element.

12. The package according to claim 11, in which the opaque layer extends in front of the secondary receiving optical element.

13. The package according to claim 8, comprising an opaque layer on the front face of the support plate opposite the semiconductor device, this opaque layer having openings in this opaque layer situated facing the main receiving optical element and a secondary receiving optical element.

14. The package according to claim 1, comprising barriers extending between the semiconductor device and the support plate and respectively around said optical elements.

15. The package according to claim 1, wherein the package is installed in a mobile telephone device which comprises a shell having at least one opening situated facing at least one of said optical elements.

16. The package according to claim 1, further comprising an annular ring surrounding each of the at least two optical elements and positioned between a first surface of the first integrated circuit chip and the rear face of said support plate, an interior of each annular ring defining the cavity left between the rear face of said support plate and each of the at least two optical elements.

17. The package according to claim 16, wherein the annular ring is made of a conductive material.

18. The package according to claim 17, wherein the conductive material of the annular ring makes electrical contact with a pad located on the first surface of the first integrated circuit chip.

19. A semiconductor package, comprising:
a support plate made of a light radiation transmissive material and having at least one elongate hole open at least on a rear face of this support plate,
an integrated circuit semiconductor device mounted on the rear face of said support plate and having at least two optical elements facing the rear face of said support plate, the integrated circuit semiconductor device passing above the elongate hole and the optical elements being placed on each side of said elongate hole, the at least two optical elements comprising a main receiving optical element and a secondary receiving optical element, the main receiving optical element and the secondary receiving optical element situated on the rear face of the support plate and on each side of said hole filled with opaque material; and
an encapsulation block made of a single-composition opaque material encapsulating the semiconductor device on said support plate at least by enveloping a periphery of said integrated circuit semiconductor device and filling said elongate hole to form an optical insulation partition between said optical elements and leaving empty cavities remaining between the optical elements and the support plate.

20. The package according to claim 19, in which the main receiving optical element and the secondary receiving optical element are formed in a single chip.

21. A package, comprising:
a first integrated circuit chip having a first surface including a first receiving optical element and a second receiving optical element;
a light radiation transmissive support plate including:
a first region positioned over the first receiving optical element; and
a second region positioned over the second receiving optical element, wherein the light radiation transmissive support plate includes an elongate hole extending between the first and second light radiation transmissive support regions, said elongate hole positioned over the first surface of the first integrated circuit chip between the first and second receiving optical elements; and
a single-composition opaque material encapsulation block which encapsulates the first integrated circuit chip at least by enveloping the first integrated circuit chip's periphery and filling said elongate hole so as to form an optical insulation partition between said first and second receiving optical elements while leaving a cavity between a rear face of the light radiation transmissive support plate and each of the first and second optical elements, respectively.

22. The package of claim 21, further comprising: an opaque layer covering a front face of the light radiation transmissive support plate, said opaque layer including an opening positioned in alignment with the first receiving optical element without any opening in alignment with the second receiving optical element.

23. The package of claim 22, further comprising a second integrated circuit chip having a first surface including a third emitting optical element; and wherein said light radiation transmissive support plate includes a third region positioned over the third emitting optical element.

24. The package of claim 23, said opaque layer including an opening positioned in alignment with the third emitting optical element.

25. The package of claim 21, further comprising an annular ring surrounding each of the first and second receiving optical elements and positioned between the first surface of the first integrated circuit chip and the rear face of the light radiation transmissive support plate, an interior of each annular ring defining the cavity left between the rear face of the light radiation transmissive support plate and each of the first and second receiving optical elements.

26. The package of claim 25, wherein the annular ring is made of a conductive material.

27. The package of claim 26, wherein the conductive material of the annular ring makes electrical contact with a pad located on the first surface of the first integrated circuit chip.

28. A semiconductor package comprising:
a light radiation transmissive support plate having at least one elongate hole open at least on the side of a rear face of the support plate;
an integrated circuit chip mounted on the rear face of the support plate and having at least two optical elements, the integrated circuit chip passing directly above the elongate hole and the at least two optical elements being placed on either side of the elongate hole; and
an encapsulation block made of an opaque material encapsulating the integrated circuit chip on the support plate, enveloping the integrated circuit chip's periphery and filling the elongate hole, the elongate hole forming an optical insulation partition between the at least two optical elements.

29. The semiconductor package of claim 28, wherein the encapsulation block is made of a single composition material.

30. The semiconductor package of claim 28, wherein the encapsulation block leaves cavities remaining between the at least two optical elements and the support plate.

31. The semiconductor package of claim 30, wherein the cavity is not filled with a transparent material.

32. The semiconductor package of claim 28, further comprising an additional integrated circuit chip mounted on the rear face of the support plate and having at least one optical element, the additional integrated circuit chip disposed next to the integrated circuit chip.

33. The semiconductor package of claim 32, wherein the additional integrated circuit chip has an emitting optical element.

34. The semiconductor package of claim 33, wherein the integrated circuit chip has at least two receiving optical elements optically separated by the elongate hole filled with the opaque material of the encapsulation block.

35. The semiconductor package of claim 28, further comprising an annular ring surrounding each of the at least two optical elements and positioned between a first surface of the single integrated circuit chip and the rear face, an interior of each annular ring defining the cavity left between the rear face of the light radiation transmissive support plate and each of the at least two optical elements.

36. The semiconductor package of claim 35, wherein the annular ring is made of a conductive material.

37. The semiconductor package of claim 36, wherein the conductive material of the annular ring makes electrical contact with a pad located on the first surface of the first semiconductor device.

* * * * *